United States Patent [19]

Ernst

[11] 3,838,303

[45] Sept. 24, 1974

[54] MOUNTING APPARATUS FOR DISC-TYPE SEMICONDUCTORS

[75] Inventor: Richard G. Ernst, Anoka, Minn.

[73] Assignee: Electric Machinery Mfg., Minneapolis, Minn.

[22] Filed: Mar. 21, 1973

[21] Appl. No.: 343,427

[52] U.S. Cl. .................... 310/68 D, 317/234 P

[51] Int. Cl. .................... H02k 11/00

[58] Field of Search .............. 310/68 R, 68 D, 68 E; 174/52 R, 52 S, DIG. 5; 317/234 P; 248/324, 325, 162

[56] References Cited

UNITED STATES PATENTS

| | | | |
|---|---|---|---|
| 3,521,132 | 7/1970 | Petersen et al. | 317/234 P |
| 3,654,528 | 4/1972 | Barkan | 317/234 P |
| 3,721,843 | 3/1973 | Spisak et al. | 310/68 R |

*Primary Examiner*—R. Skudy
*Assistant Examiner*—Harry E. Moose, Jr.
*Attorney, Agent, or Firm*—Merchant, Gould, Smith & Edell

[57] ABSTRACT

An improved semiconductor mounting apparatus for mounting high power disc-type packaged semiconductors for operative use on rotating members of electric machines. A first heat sink mounting member is rigidly mounted for rotation with a rotating member of the machine. A second heat sink mounting member is movably clamped to the first balanced sink member and aligned therewith to sandwich a disc-type semiconductor therebetween. The mounting clamp includes spring washers for enabling a predetermined clamping force to be applied to the semiconductor electrodes. The second heat sink, in response to centrifugal force, applies a controlled contact pressure to the semiconductor electrodes that varies with the rotational speed of the motor and equals the desired mounting pressure at the synchronous speed of the motor. In an alternate embodiment, the first and second heat sink members are pre-clamped to the semiconductor at the desired contact mounting pressure. A counterweight apparatus, responsive to centrifugal force, balances the centrifugal force effect upon the second heat sink member during rotation to maintain a constant mounting pressure upon the semiconductor electrodes regardless of the rotational speed of the motor.

9 Claims, 7 Drawing Figures

MOUNTING APPARATUS FOR DISC-TYPE SEMICONDUCTORS

BACKGROUND OF THE INVENTION

1. Field of the Invention

This invention relates generally to semiconductor mounting apparatus, and more specifically to apparatus for mounting high current semiconductors for use in synchronous alternating current machines of the brushless type.

2. Description of the Prior Art

Synchronous alternating current machines of the type usually referred to as brushless, generally have a stationary member with an alternating current (AC) winding, and a rotating member with a direct current (DC) main field winding. Excitation for the DC field winding is provided by an AC exciter which has a stationary DC exciter field member and a rotating AC exciter armature member which is mounted on the same shaft as the field winding of the main machine. The exciter armature winding is connected to the main DC field winding through a rectifier assembly, which rotates with the main DC field winding and the AC exciter armature winding, for supplying DC excitation to the main field winding of the machine. The foregoing apparatus provides an AC machine which does not require a commutator, slip rings or brushes that would otherwise be necessary in a conventional type of machine using a DC exciter. The advantages of this type of AC machine are well known in the art and will not be belaboured here.

Large synchronous AC motors (of the brushless type) also typically include a semiconductor control circuit for controlling current flow through the main DC field winding during start-up of the motor. The semiconductor control circuit is mounted for rotation with the DC field winding and prevents the exciter from energizing the main DC field winding by means of the rectifier semiconductors, until the rotating members have attained a rotational speed in excess of 90 percent of the desired rotational (synchronous) speed of the motor. The rotating rectifiers and the semiconductors within the control unit are generally mounted in suitable circuit configurations on a circular support member (often referred to as a diode wheel) which is rotated by a main shaft of the motor.

The environmental conditions in which the rotating semiconductors must operate have created unique mounting problems for the semiconductors and have placed undesired power limitations on their use in the art. Specifically, the high currents generally passed by the rectifier and control semiconductors require that the semiconductors be adequately cooled to insure proper operation of the semiconductors and to protect their junctions. However, the high rotational speeds at which they must operate subject both the semiconductors and their cooling heat sinks to large and potentially damaging centifugal forces.

In attempting to solve the aforementioned problems, prior art brushless AC synchronous machines have generally employed "stud" mounted semiconductors arranged in varied configurations on the diode wheel to maximize the cooling and to minimize adverse effects of centrifugal forces on the semiconductors. A semiconductor mounted in the stud configuration provides direct cooling to one side of the semiconductor wafer. The stud is generally an externally threaded member which is also an electrode of the semiconductor and is designed to be screwed into a heat sink, thereby providing direct cooling to one side of the semiconductor. The other side of the semiconductor, however, is generally cooled only by convection due to the ambient airflow and by means of heat transfer through the electrode and connecting lead from the non-stud side of the semiconductor.

Semiconductor manufacturers have generally recognized that the higher power dissipating semiconductors cannot be adequately cooled if they are stud mounted, but that both sides of the semiconductor require continuous cooling. Accordingly, high power "disc-type" semiconductors have recently been designed which provide direct conductive cooling to both surfaces of a semiconductor wafer. A number of rectifier and controlled rectifier disc-type semiconductors (variously known as "power pack," "power-disc," "press-pak" and the like) are generally adapted to be mounted in a sandwiched configuration directly between two conducting heat sink terminals. Silicon controlled rectifiers (SCR's) generally receive the most benefit from the disc-type packaging configuration since SCR junctions are typically rated for lower temperature operation than power diode junctions.

To insure proper heat dissipation from and high power efficiency of the disc-type semiconductors, they must be pressure mounted between the two thermally and electrically conducting heat sinks at large mounting pressures having extremely small tolerance bands. As a result, such disc-type semiconductors, while providing the required increased power capabilities for large AC synchronous machines, have not heretofore been practical for use therein due to inadequate mounting apparatus for the disc-type semiconductors at high rotating speeds.

Using prior art mounting apparatus, centrifugal forces exerted at operating speeds directly on the discs themselves and indirectly through their mounting heat sinks have either exceeded the maximum stress and tolerance limits of the devices or caused less than the required mounting pressure to be maintained on both surfaces of the disc.

Over-stressing of the disc-type semiconductors can result in a physical crushing of both the semiconductor wafer and its packaging medium. Under-stressing of the disc-type semiconductors does not provide for adequate thermal and electrical conduction therefrom, thereby rendering it highly inefficient, or resulting in severe damage of the device due to over-heating.

The present invention overcomes the aforementioned problems of using high powered disc-type semiconductors in rotating applications, by providing a highly reliable and efficient means for mounting the disc-type semiconductors within an environment in which they are subjected to large and varying centrifugal forces. The mounting apparatus of the present invention provides direct heat sinking of both sides of the disc-type semiconductor and is responsive to the rotational speed of a synchronous motor in which employed, to maintain the required mounting force of the heat sinks upon the disc-type semiconductor without exceeding the tight tolerance placed thereon.

While the present invention will be described in conjunction with its use in an AC brushless synchronous motor, it will be understood that the invention is not limited to this use and can be employed in any rotating equipment requiring the use of high powered disc-type semiconductors. Further, while the present invention as described employs specific centrifugal force responsive configurations, it will be understood that the invention is not limited to these particular configurations but that any equivalent apparatus which performs the desired functions may be employed without departing from the spirit or intent of this invention. Also, while the present invention will be described in conjunction with its use with a particular disc-type semiconductor, it will be understood that the invention is not limited to its use with that semiconductor but may be used with any semiconductor having a similar physical configuration and mounting requirements.

SUMMARY OF THE INVENTION

A pair of mounting members having complementary mounting surfaces, are clamped together in a manner enabling a disc-type semiconductor to be sandwiched between the complementary surfaces. The mounting members provide mechanical contact pressure connections to the electrodes of a disc-type semiconductor sandwiched therebetween, and thereby serve as conductors of electrical and thermal energy therefrom. The mounting members include cooling fins to provide additional thermal cooling to the semiconductor.

Spring-loaded clamps mechanically connecting the mounting members enable relative movement of the mounting members with respect to one another in a manner which maintains a uniform compressive pressure upon the electrode surfaces of the disc-type semiconductor sandwiched therebetween. The clamps are adjustable for enabling a predetermined compressive mounting pressure to be applied by the mounting members to the semiconductor electrodes. Insulation barriers cooperate with the clamps to electrically insulate the mounting members from each other.

The mounting members are sized for mounting between two discs of a "diode wheel" which is connected for rotation with a shaft of an AC brushless synchronous machine. The clamped mounting members are mounted between the diode wheel discs such that one of the mounting members is rigidly attached to the rotatable discs and is not responsive to centrifugal forces applied thereto during rotation with the diode wheel discs. The second mounting member, clamped to the first mounting member, is not rigidly attached to the rotating discs and is responsive to centrifugal forces applied thereto during rotation.

In one embodiment of the invention, the mounting members are clamped about a disc-type semiconductor by means of clamping bolts, belleville spring washers and insulators. The clamping bolts are tightened so as to clamp the sandwiched semiconductor between the mounting members at a predetermined mounting pressure which is less than the required mounting pressure for proper operation of the semiconductor. The mounting member assembly is mounted on the diode wheel discs such that when rotating, centrifugal force applied to the second mounting member will cause it to exert a varying contact pressure upon the semiconductor electrode surfaces which increases in relation to the speed of rotation. The second mounting member is sized and weighted so as to exert the required mounting pressure upon the semiconductor electrodes when the desired rotational speed of the motor shaft is attained.

In a second embodiment of the invention, the mounting members are clamped about a disc-type semiconductor by means of an insulating, adjustable spring-type clamp. The clamp is adjusted such that a predetermined mounting pressure is exerted by the mounting members upon the semiconductor electrode surfaces which equals the required mounting pressure. The mounting member assembly is mounted on the diode wheel discs such that when rotating, centrifugal force applied to the second mounting member will cause it to exert a varying contact pressure on the semiconductor electrode surfaces which decreases in relation to the speed of rotation. A counterweight apparatus is also mounted on the diode wheel for rotation therewith and includes an arm which cooperatively engages the second mounting member. The counterweight apparatus acts in response to centrifugal force applied thereto during rotation to apply a varying counterforce through a fulcrum upon the second mounting member which increases in relation to the speed of rotation and is exactly equal and opposite in magnitude and direction to the centrifugal force exerted upon the second mounting member. The varying counterforce and the centrifugal force applied to the second mounting member, therefore, exactly cancel one another, thereby enabling the contact mounting pressure applied to the semiconductor electrode surfaces to remain constant regardless of the rotational speed of the diode wheel.

It is one object of the present invention, therefore, to provide a novel mounting apparatus for high power disc-type semiconductors.

It is another object of the present invention to provide a mounting apparatus for high power disc-type semiconductors for use in the rotating members of AC synchronous machines.

It is a further object of the present invention to provide a mounting apparatus for rotating disc-type semiconductors which maintain accurate mounting pressures upon the semiconductor electrode surfaces regardless of the speed at which the apparatus rotates.

It is a further object of the present invention to provide a mounting apparatus for high power rotating disc-type semiconductors which provides reliable thermal cooling of the semiconductors.

These and other objects of my invention will become apparent to those skilled in the art upon consideration of the accompanying specification, claims and drawings.

BRIEF DESCRIPTION OF THE DRAWING

Referring to the drawing, wherein like numerals represent like parts throughout the several views.

DESCRIPTION OF THE PREFERRED EMBODIMENT

Figures 1, 2, 3, 4:
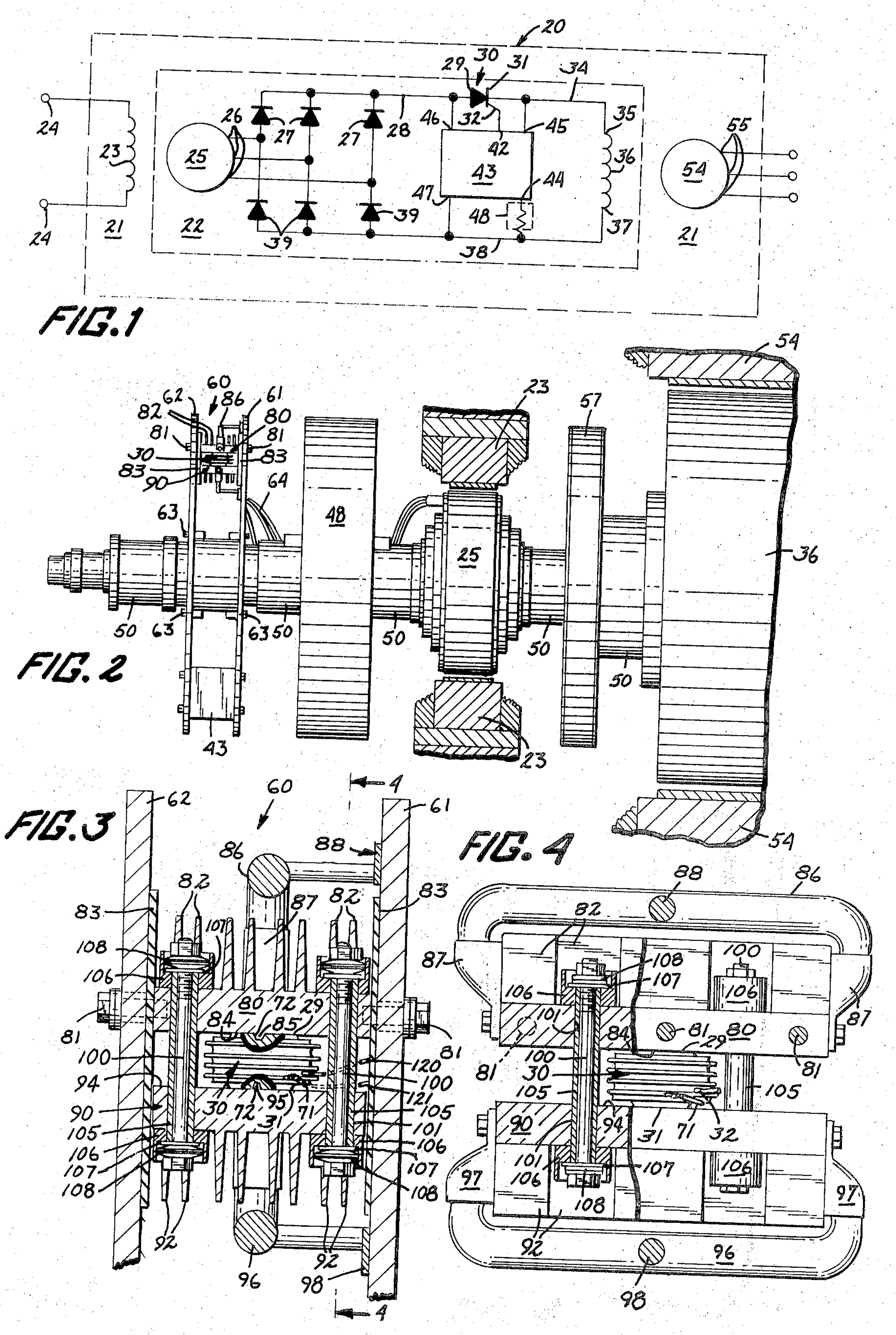
FIG. 1 is a block diagram representation of the main electrical components of an alternating current brushless synchronous motor.
FIG. 2 is a diagrammatic view of a portion of an alternating current brushless synchronous motor illustrating a typical relative positioning of its component parts.
FIG. 3 is a diagrammatic vertical sectional view, with portions thereof broken away, of one embodiment of the semiconductor mounting apparatus of the present invention disclosed in FIG. 2.
FIG. 4 is a sectional view taken generally along line 4—4 of the mounting apparatus disclosed in FIG. 3.

Referring to the Figures, there are generally shown in FIG. 1 the electrical components of an AC brushless synchronous motor 20, the description and operation of which are well known in the art and will not be detailed herein. In general, however, the synchronous motor 20 comprises non-rotating elements generally designated at 21 and rotating elements generally designated at 22. A stationary DC exciter field winding 23 has a pair of terminals 24 adapted for connection to a power source (not shown). An AC exciter armature member 25 is mounted for rotation on a shaft 50 of the motor 20 (FIG. 2). The AC exciter armature 25 is comprised of three phase windings (not shown but well known in the art) terminating in three output terminals 26. The output terminals 26 are connected by means of a plurality of "forward" rectifying diodes 27 and a positive bus 28 to an anode 29 of a silicon controlled rectifier (SCR) 30. The SCR 30 further has a cathode 31 and a gate 32.

The cathode 31 of the SCR 30 is connected by means of a bus 34 to a positive terminal 35 of a main DC field winding 36 of the synchronous motor 20. The main DC field winding 36 further has a negative terminal 37 connected by means of a negative bus 38 and a plurality of "reverse" rectifier diodes 39 to the output terminals 26 of the three phase windings of the AC exciter armature 25.

The gate 32 of the SCR 30 is directly connected to a first output terminal 42 of a control unit 43. The control unit 43 further has a second output terminal 44, a first input terminal 45, a second input terminal 46 and a third input terminal 47. The first input terminal 45 of the control unit 43 is connected by means of the bus 34 to the positive terminal 35 of the main DC field winding 36. The second input terminal 46 is directly connected to the positive bus 28. The third input terminal 47 is directly connected to the negative bus 38. The second output terminal 44 of the control unit 43 is connected by means of a field dissipation resistor network, generally designated as 48, to the negative bus 38.

The control unit 43 comprises control circuits properly configured to control the source of current flow through the main DC field winding 36, as hereinafter described in the section entitled "Operation of the Preferred Embodiment." The control unit is typically referred to in the art as "field application control circuitry."

A stationary three phase AC main winding member 54 has three input terminals 55 adapted for connection to an external AC power source (not shown).

FIG. 2 diagrammatically illustrates a typical relative positioning of the main components of the AC brushless synchronous motor 20 described in FIG. 1. Referring to FIG. 2, it will be noted that the rotating elements 22 are connected to the shaft 50 of the motor 20 for rotation therewith. The stationary AC windings 54 are positioned to functionally cooperate with the main DC field winding 36. A blower 57 is attached to the shaft 50 to aid in cooling the components of the motor 20. The stationary DC exciter field winding 23 is positioned to functionally cooperate with the AC exciter armature windings 25. The field dissipation resistor network 48 is generally comprised of a cylindrical member housing a plurality of dissipation resistors which rotate with the shaft 50.

A diode wheel 60 is generally comprised of an inner disc member 61 and an outer disc member 62 connected by means of a plurality of nuts 63 to the shaft 50 for rotation therewith. The inner and outer disc members 61 and 62 respectively are comprised of electrical insulator fiberboard material to which are secured the forward and reverse rectifier diodes 27 and 39 respectively, the control unit 43, the SCR 30 and their associated electrical interconnections. The electrical components secured to and between the inner and outer disc members 61 and 62 of the diode wheel 60 are generally configured so as to provide dynamic rotational balance to the diode wheel 60. The components secured to the diode wheel are also generally positioned thereon so as to receive maximum cooling by the ambient air when the diode wheel 60 is rotating.

In general, electrical connections from elements mounted on the diode wheel 60 to the field dissipation resistor network 48 and to the exciter armature windings 25 are made by means of the conductors generally designated at 64, which physically pass through the shaft 50. Similarly, electrical connections to the main DC field winding 36 from the electrical components mounted on the diode wheel 60 are made by means of the negative bus 38 and the bus 34 (as illustrated in FIG. 1) which physically pass through (not shown in FIG. 2) the shaft 50.

A preferred embodiment of the semiconducting mounting apparatus of the present invention is illustrated in FIGS. 2, 3 and 4. The semiconductor mounting apparatus is illustrated in relation to its use in mounting the SCR 30 to the inner and outer discs 61 and 62 respectively of the diode wheel 60.

Figures 5, 6, 7:
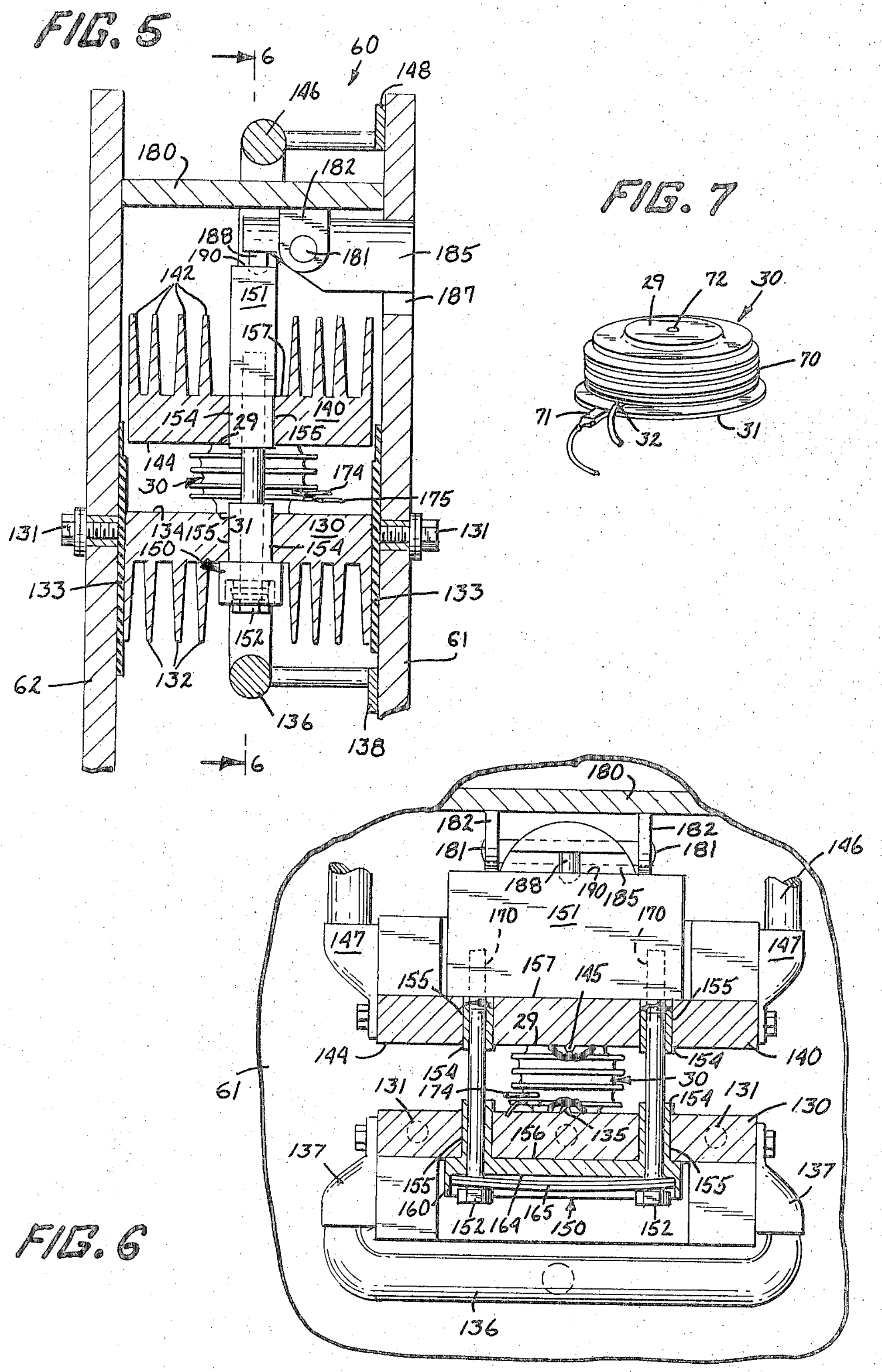
FIG. 5 is a diagrammatic vertical sectional view of a second embodiment of the semiconductor mounting apparatus of the present invention.
FIG. 6 is a section view taken generally along line 6—6 of the semiconductor mounting apparatus disclosed in FIG. 5.
FIG. 7 is a perspective view of a disc-type semiconductor disclosed in the apparatus illustrated in the views of FIGS. 2 through 6.

The SCR 30 is a high power device packaged in a disc-type configuration (illustrated in FIG. 7) and known by various names in the art such as "Power Pack," "Power-Disc" and "Press-Pak." Referring to FIG. 7, the disc-type packaged SCR 30 is encapsulated in a finned ceramic encapsulant 70 for aiding in thermal cooling of the device. Pressure contact electrodes on opposing ends of the semiconductor disc provide direct electrical and thermal contact to the anode 29 and to the cathode 31 of the SCR 30. The disc-type semiconductors are generally internally configured (not shown) such that direct electrical and thermal paths are provided from the external electrodes to the opposing surfaces of the encapsulated semiconductor wafer.

Connection to the gate 32 of the disc-type SCR 30 is provided by means of a terminal of like number radially protruding through the encapsulant 70. A connector tab 71 is provided on the cathode electrode 31 of the SCR 30 for providing a hard-wired return path for the gate to cathode current. The anode and cathode electrode surfaces 29 and 31 respectively each have a small alignment hole 72 generally positioned at the center of their electrode surfaces adapted to receive an alignment stud of a cooperating mounting surface.

The diagrams of FIGS. 2, 3 and 4 generally illustrate a preferred embodiment of the mounting apparatus for disc-type semiconductors of the present invention. Referring in particular to FIGS. 3 and 4, a first heat sink mounting member 80 is sized for mounting between the inner and outer discs 61 and 62 respectively of the diode wheel 60. In the preferred embodiment, the first heat sink 80 is rigidly attached to the inner and outer discs 61 and 62 respectively of the diode wheel 60 by means of six bolts 81 protruding through holes in the inner and outer discs 61 and 62 and threaded into the first heat sink 80. It will be recognized that although six bolts are employed in the preferred embodiment to secure the first heat sink 80 to the diode wheel 60, any number of bolts could be used and any other means of mounting could be employed which insures that the first heat sink 80 is immovably attached to the diode wheel 60.

The first heat sink 80 has a plurality of outwardly radiating cooling fins 82 generally extending along that surface of the heat sink 80 furthest from the shaft 50 and running generally parallel with the surfaces of the inner and outer discs 61 and 62 respectively. The first heat sink 80 also has a generally flat mounting surface 84 suitable for providing a contact mounting surface for an electrode surface of a disc-type semiconductor. An alignment stud 85 protrudes from the center of the mounting surface 84 and is sized for positioning within an alignment hole in an electrode surface of a disc-type semiconductor (see alignment hole 72 of FIG. 7).

Sheets of insulating material 83 are positioned to separate the secured ends of the first heat sink 80 from the inner and outer discs 61 and 62 respectively, thereby providing electrical insulation between the first heat sink 80 and any electrically conductive printed circuit patterns or the like on the inner and outer discs 61 and 62 respectively.

An electrical bus 86 is bolted to the unsecured ends of the heat sink 80 by means of a pair of brackets 87. The bus 86 is directly attached to a bus bar 88 on the inner diode wheel 61.

A second heat sink mounting member 90, generally similar in construction to the first heat sink 80 is sized for movable mounting between the inner and outer discs 61 and 62 respectively of the diode wheel 60. The second heat sink 90 has a plurality of outwardly radiating cooling fins 92 generally extending along that surface of the heat sink 90 closest to the shaft 50 and generally running parallel with the surfaces of the inner and outer discs 61 and 62 respectively.

The second heat sink 90 also has a generally flat mounting surface 94 suitable for providing a contact mounting surface for an electrode surface of a disc-type semiconductor. An alignment stud 95 protrudes from the center of the mounting surface 94 of the second heat sink 90, and is sized for positioning within an alignment hole in an electrode surface of a disc-type semiconductor (see FIG. 7).

An electrical bus 96 is bolted by means of a pair of brackets 97 to those opposing ends of the second heat sink 90 which are positional duals of the unsecured ends of the first heat sink 80. The bus 96 is directly connected to a bus bar 98 secured to the inner disc 61.

The second heat sink 90 is clamped to the first heat sink 80 by means of four clamping bolts 100 extending through four aligned holes 101 in each of the first and second heat sinks 80 and 90 respectively. The aligned holes 101 are positioned to enable the clamping bolts 100 to align the second heat sink 90 with the first heat sink 80 such that their mounting surfaces 94 and 84 respectively are positioned opposite to and generally parallel with one another.

The second heat sink 90 when clamped to the first heat sink 80 is permitted to move in a radial direction with respect to the diode wheel 60 as guided by the clamping bolts 100. The insulating sheets 83 extend between those ends of the second heat sink 90 which are positioned in close proximity with the inner and outer discs 61 and 62 respectively, for preventing electrical contact between the second heat sink 90 and any electrically conductive elements on the inner and outer discs 61 and 62 respectively.

An insulating tubing 105 surrounds each of the clamping bolts 100 and extends through the aligned holes 101 of the first and second heat sinks 80 and 90 respectively to provide electrical insulation therebetween. An insulating grommet 106, a washer 107, and a plurality of belleville spring washers 108 are positioned between the heads and nuts of the clamping bolts 100 and the first and second heat sink members 80 and 90. As the nuts of the clamping bolts are tightened, a compressive force is exerted, as hereinafter described, by the clamping apparatus upon the first and second heat sink members 80 and 90 respectively tending to draw the second heat sink member 90 toward the first heat sink member 80.

It will be understood that although a particular cooling fin arrangement has been illustrated for the heat sinks 80 and 90, other fin arrangements may equally well be employed within the spirit and intent of this invention. Further, although specific clamping apparatus and configurations have been illustrated, other clamping apparatus and configurations which perform the same operative functions may also be employed without departing from the spirit or intent of this invention. In particular, alternate clamp configurations may be employed which function to (1) insure a uniform clamping force when not rotating on the surfaces of an object clamped between the mounting surfaces 84 and 94 of the heat sinks 80 and 90 respectively; (2) maintain the relative lateral positioning of the second heat sink 90 with respect to the first heat sink 80 when the diode wheel 60 is rotating so as not to cause binding of the second heat sink 90 against the surfaces of the inner and outer discs 61 and 62 respectively; and (3) enable relative movement of the second heat sink member with respect to the first heat sink member while maintaining a uniform pressure gradient across the mounting surfaces 84 and 94 which are contacting an object placed therebetween.

FIGS. 2 through 4 illustrate the first and second heat sink members 80 and 90 respectively as clamped together in their relative operative positions about the disc-type semiconductor 30. In the preferred embodiment, the mounting surface 84 of the first heat sink member 80 is positioned in direct contact with the anode electrode surface 29 of the SCR 30. The anode electrode surface 29 of the SCR 30 is positioned on the mounting surface 84 of the first heat sink member 80 such that the alignment stud 85 is inserted within the alignment hole 72 of the anode electrode surface 29.

Similarly, the mounting surface 94 of the second heat sink 90, when clamped in operative position as illustrated, is in direct contact with the cathode electrode surface 31 of the SCR 30. The cathode electrode surface 31 of the SCR 30 is positioned on the mounting surface 94 of the second heat sink member 90 such that the alignment stud 95 is inserted within the alignment hole 72 in the cathode electrode surface 31 of the SCR 30. The gate and cathode connector tab connections 32 and 71 respectively of the SCR 30 (FIG. 7) are directly connected by means of conductor wires 120 and 121 respectively to appropriate electrical bus connections (not shown) on the inner disc 61 circuitry.

Although not illustrated, in the preferred embodiment, a thermal conduction paste material is applied to the mounting surfaces 84 and 94 of the heat sinks 80 and 90 respectively before insertion and compression of the disc-type SCR 30 therebetween, to aid in thermal conduction between the mounting surfaces and the SCR electrodes.

An alternate embodiment of the disc-type semiconductor mounting apparatus of the present invention is illustrated in FIGS. 5 and 6. It will be noted that the semiconductor mounting apparatus illustrated in FIGS. 5 and 6 is adapted to be relatively positioned on the diode wheel 60 as illustrated in FIG. 2.

Referring to FIGS. 5 and 6, a first heat sink mounting member 130 is sized for mounting between the inner and outer discs 61 and 62 respectively of the diode wheel 60. In the preferred embodiment, the first heat sink member 130 is rigidly attached to the inner and outer discs 61 and 62 of the diode wheel 60 by means of six bolts 131 protruding through holes in the inner and outer discs 61 and 62 and threaded into the first heat sink 130. It will be recognized that although six bolts are employed in the preferred embodiment to secure the first heat sink 130 to the diode wheel 60, any number of bolts could be used and any other means of mounting could be employed which insures that the first heat sink 130 is immovably attached to the diode wheel 60.

The first heat sink 130 has a plurality of outwardly radiating cooling fins 132 generally extending along that surface of the heat sink 130 closest to the shaft 50 and generally running parallel with the surfaces of the inner and outer discs 61 and 62 respectively. The first heat sink 130 has a generally flat mounting surface 134 suitable for providing a contact mounting surface for an electrode surface of a disc-type semiconductor. An alignment stud 135 protrudes from the center of the mounting surface 134 and is sized for positioning within an alignment hole in an electrode surface of a disc-type semiconductor (see alignment hole 72 of FIG. 7).

Sheets of insulating material 133 are positioned to separate the secured ends of the heat sink 130 from the inner and outer discs 61 and 62 respectively, thereby providing electrical insulation between the first heat sink 130 and any electrically conductive printed circuit patterns or the like on the inner and outer discs 61 and 62 respectively.

An electrical bus 136 is bolted to the unsecured ends of the heat sink 130 by means of a pair of brackets 137. The bus 136 is directly attached to a bus bar 138 on the inner diode wheel 61.

A second heat sink mounting member 140, generally similar in construction to the first heat sink member 130 is sized for movable mounting between the inner and outer discs 61 and 62 respectively of the diode wheel 60. The second heat sink 140 has a plurality of outwardly radiating cooling fins 142 generally extending along that surface of the heat sink 140 farthest from the shaft 50 and generally running parallel with the surfaces of the inner and outer discs 61 and 62 respectively.

The second heat sink 140 has a generally flat mounting surface 144 suitable for providing a contact mounting surface for an electrode surface of a disc-type semiconductor. An alignment stud 145 protrudes from the center of the mounting surface 144 of the second heat sink 140, and is sized for positioning within an alignment hole in an electrode surface of a disc-type semiconductor (FIG. 7).

An electrical bus 146 is bolted by means of a pair of brackets 147 to opposing ends of the second heat sink member 140. The bus 146 is directly connected to a bus bar 148 secured to the inner disc 61.

The second heat sink 140 is clamped to the first heat sink 130 by means of a clamping apparatus generally comprising a first clamping bar 150, a second clamping bar 151 and a pair of clamping bolts 152. The first and second clamping bars 150 and 151 respectively each have a pair of boss projections 154 forming a sleeve for the clamping bolts 152. The first and second clamping bars 150 and 151 respectively are made of electrically insulating material, thereby providing electrical insulation between the first and second heat sink members 130 and 140 respectively when in a clamped position.

The boss projections 154 of the first and second mounting bars 150 and 151 respectively are positioned to protrude through two aligned holes 155 in each of the first and second heat sink members 130 and 140. When so positioned, a clamping surface 156 of the first clamping bar 150 is in direct contact with the finned surface of the first heat sink 130, and a clamping surface 157 of the second mounting clamp 151 is in direct contact with the finned surface of the second heat sink 140. The contact between the clamping surfaces 156 and 157 and the first and second heat sink members 130 and 140 respectively is such so as to maintain an even distribution of pressure therebetween. The aligned holes 155 are positioned such that the clamping bolts 152 when positioned through the sleeves of the first and second clamping bars 150 and 151 respectively, will align the second heat sink 140 with the first heat sink 130 such that their respective mounting surfaces 140 and 134 are positioned opposite to and generally parallel with one another.

The second heat sink 140 when clamped to the first heat sink 130 is permitted to move in a radial direction with respect to the diode wheel 60 as guided by the clamping bolts 152 and clamping bars 150 and 151. The insulating sheets 133 extend between those ends of the second heat sink 140 which are positioned in close proximity with the inner and outer discs 61 and 62 respectively, to preventing electrical contact between the second heat sink 140 and any electrically conductive elements on the inner and outer discs 61 and 62 respectively.

The first clamping bar 150 has a recessed opening 160 in one surface forming a shoulder 164 for receiving a plurality of spring leafs 165. The bolt heads of the clamping bolts 152 compresses the spring leafs 165 against the shoulder 164 of the first mounting bar 150.

The second mounting bar 152 has a pair of threaded holes 170 aligned with the sleeve openings in the boss members 154 to receive the threaded ends of the clamping bolts 152.

FIGS. 5 and 6 illustrate the first and second heat sink members 130 and 140 respectively as clamped together in their relative operative positions about the disc-type semiconductor 30. Referring to FIGS. 5 and 6, the mounting surface 134 of the first heat sink member 130 is positioned in direct contact with the cathode electrode surface 31 of the SCR 30. The cathode electrode surface 31 of the SCR 30 is positioned on the mounting surface 134 of the first heat sink member 130 such that the alignment stud 135 is inserted within the alignment hole 72 of the cathode electrode surface 29.

Similarly, the clamping bolts 152 are threaded into the threaded holes 170 of the second clamping bar 151 such that the mounting surface 144 of the second heat sink 140 is in direct contact with the anode electrode surface 29 of the SCR 30. The anode electrode surface 29 of the SCR 30 is positioned on the mounting surface 144 of the second heat sink member 140 such that the alignment stud 145 is inserted within the alignment hole 72 in the anode electrode surface 29. The gate and cathode connector tab connections 32 and 71 respectively of the SCR 30 are directly connected by means of conductor wires 174 and 175 respectively to appropriate electrical bus connections (not shown) on the inner disc 61 circuitry.

Although not illustrated, in the preferred embodiment, a thermal conduction paste material is applied to the mounting surfaces 134 and 144 of the heat sinks 130 and 140 respectively before insertion and compression of the SCR 30 therebetween, to aid in thermal conduction between the mounting surfaces of the heat sinks and the electrode surfaces of the SCR 30.

A support bar 180 is rigidly secured between the inner and outer discs 61 and 62 respectively of the diode wheel 60. A fulcrum bar 181 extends between two downwardly depending flanges 182 of the support bar 180, and is pivotally attached thereto.

A counterweight 185 is rigidly secured to the fulcrum bar 181 for pivotal motion therewith. The counterweight 185 extends through an opening 187 in the inner disc 61 of the diode wheel 60 and is movable in a radial direction therein. The opening 187 in the inner disc 61 is sized to allow the counterweight 185 to move several thousandths of an inch. A downwardly depending rod 188 forms a part of the counterweight 185 and directly contacts the center of a top surface 190 of the second clamping bar 151, when the diode wheel 60 is not rotating. The rod 188 of the counterweight 185 may comprise an adjustable set screw member.

The top surface 190 of the second clamping bar 151 bears a slight depression at its center for accepting the end of the rod 188. It will be noted that, although a particular configuration of the counterweight 185 and supporting apparatus have been shown, the invention is not limited to this particular configuration but applies equally well to any apparatus which performs a like function. Further, although particular clamping configurations and heat sink cooling fin arrangements have been illustrated, the invention is not limited to use of these particular configurations as previously mentioned.

Operation of the Preferred Embodiment

Operation of the AC brushless synchronous motor illustrated in FIG. 1 is well known in the art. The main DC field winding 36 of the motor 20 is energized by the stationary three phase AC winding member 54. Under normal synchronous operation, the main DC field winding 36 also receives a DC current from the exciter members of the motor 20 by means of the SCR 30. The stationary DC exciter field winding 23 energizes the windings of the AC exciter armature 25 which provides a rectified DC current by means of the forward and reverse rectifier diodes 27 and 39 respectively to the anode 29 of the SCR 30.

The gate 32 of the SCR 30 is regulated by means of the control unit 43. During initial start-up of the motor 20, and before the motor 20 has attained its synchronous speed, the control unit 43 is operative to provide a circuit path in parallel with the main DC field winding 36 consisting of the bus 34, the first input terminal 45, circuits within the control unit 43, the second output 44, the field dissipation resistor network 48 and the negative bus 38. The control unit 43 simultaneously delivers a deenergizing signal to the gate 32 of the SCR 30 by means of its first output terminal 42. Therefore, during start-up of the motor 20, the main DC field winding 36 is essentially short circuited through the field dissipation resistor network 48 and is not excited by the exciter elements. Such a condition is desirable to reduce induced voltage across the main field winding 36 and across the rectifier bridge network, and aids the torque curve during starting of the motor 20. During start-up of the motor 20, the large currents generated in the field winding 36 are dissipated across a plurality of resistors within the field dissipation resistor network 48.

The control unit 43 operatively monitors the current flow through the field dissipation resistor network 48, sensing both the magnitude and frequency of the induced current flowing therethrough. When the control unit 43 senses that the rotational speed of the motor 20 is within 95 percent of its synchronous speed, the circuit path through the field dissipation resistor network 48 is opened and the SCR 30 is simultaneously triggered by means of its gate 32. The SCR 30 directly energizes the main DC field winding 36 by the rectified DC current supplied by the exciter members of the motor 20. The exciter current from the SCR 30 will cause the motor 20 to lock in on its synchronous speed.

The control unit 43 continues to monitor the signal flow through the positive and negative bus lines 28 and 38 respectively during synchronous operation of the motor 20, and will re-establish the shorting circuit path of the main DC field winding 36 through the field dissipation resistor network 48 if the motor should fall out of synchronism.

In large synchronous motors, the SCR 30 is required to pass extremely large currents, often in excess of 500 amps. It is important, therefore, to provide adequate electrical and thermal conduction from the SCR 30 electrode to enable its efficient operation and to prevent thermal over-stressing of its semiconductor wafer. The packaging configuration which most efficiently satisfies the above considerations for high power rectifiers and controlled rectifiers is generally considered to be the disc-type packaging configuration illustrated in FIG. 7. The disc-type semiconductor provides for direct contact mounting of both electrodes of the semiconductor, thereby providing simultaneous cooling of both sides of the semiconductor wafer. Heretofore, however, disc-type semiconductors have not been employed within the rotating circuits of synchronous machines due to inadequate mounting apparatus for the disc-type semiconductors when subjected to large centrifugal forces during rotation of the motor.

Referring to FIG. 2, the mounting spparatus of the present invention is generally sized, weighted, and positioned on the diode wheel 60 so as to dynamically balance other control circuitry mounted thereon. Further, the components mounted upon and between the inner and outer discs 61 and 62 respectively of the diode wheel 60 are arranged so as to generally simulate the blades of a blower fan for aiding in cooling of the high powered electrical components mounted thereon during rotation of the diode wheel with the shaft 50.

Referring to the preferred embodiment of the present invention illustrated in FIGS. 3 and 4, the SCR 30 is sandwiched between the mounting surfaces 84 and 94 of the first and second mounting members 80 and 90 respectively. The mounting surfaces 84 and 94 are designed for uniformly contacting the anode 29 and cathode 31 electrode surfaces respectively of the SCR 30. The clamping bolts 100 maintain the sandwiched arrangement and are tightened against the bias of the belleville spring washers 108 until a predetermined uniform pressure is exerted upon the anode and cathode electrode surfaces of the SCR 30. In the preferred embodiment, this mounting pressure is approximately 1,000 pounds.

The first mounting member 80 is aligned and rigidly bolted to the inner and outer discs 61 and 62 respectively of the diode wheel 60 such that an axial line of the SCR 30 if extended, would intersect at right angles a center line of the shaft 50.

When rotating, the first mounting member 80 provides a rigid support base for the anode electrode 29 of the SCR 30, and is not movably responsive to centrifugal forces applied thereon. However, centrifugal forces exerted upon the second mounting member 90 and its attached bus 96 will cause them to exert an increasing contact pressure upon the cathode electrode surface 31 of the SCR 30 which increases with the square of the rotational speed of the motor 20. It will be noted, that the second mounting member 90 is free to move in the radial direction of the diode wheel 60 as guided by the clamping bolts 100. In the preferred embodiment, the second mounting member 90, its connecting bus bar 96 and its pair of brackets 97 are weighted so as to exert in combination with the predetermined compressive force of 1,000 pounds, a compressive pressure upon the anode and cathode electrode surfaces of the SCR 30 of 4,000 pounds when the motor 20 is synchronously rotating at 1,200 rpm. The 4,000 pound mounting pressure is designed to meet the manufacturers' recommended limits for the SCR 30. Further, the belleville washer clamping apparatus illustrated allows for thermal expansion of the semiconductor 30 while remaining within the tight mounting force tolerance limits specified by the semiconductor manufacturers.

The cooling fins 82 and 92 respectively of the first and second mounting members 80 and 90 provide for increased direct cooling of the SCR 30 electrode surfaces directly contacting heat sinks.

The bus connections 86 and 96 respectively connected to the first and second mounting members 80 and 90 respectively provide current flow and additional thermal cooling capability respectively from the anode 29 and cathode 31 electrodes of the SCR 30.

An alternate embodiment of the present invention is illustrated in FIGS. 5 and 6. Referring thereto, it will be noted that the first and second mounting members 130 and 140 respectively are cooperatively clamped to sandwich the disc-type packaged SCR 30 such that their mounting surfaces 134 and 144 provide uniform direct electrical contact with the cathode 31 and anode 29 electrode surfaces respectively. The clamping apparatus generally including the second mounting member 140 is clamped to the first mounting member 130 by means of the clamping bolts 152 and the leaf springs 165 until the desired mounting pressure of 4,000 pounds is attained on the anode 29 and cathode 31 electrode surfaces of the SCR 30. The clamping bars 150 and 151 are positioned relative to the alignment studs 145 and 135 of the second and first mounting members 140 and 130 respectively, and their respective surfaces 156 and 157 are designed to contact the first and second mounting members 130 and 140 respectively such that the mounting members are clamped to provide a uniform pressure distribution across the anode and cathode electrode surfaces of the SCR 30.

The mounting apparatus is aligned and secured to the inner and outer discs 61 and 62 respectively of the diode wheel 60 by means of the bolts 131 such that an axial line of the clamped SCR 30 when extended will intersect at right angles a center line of the shaft 50 of the motor 20.

When rotating, centrifugal forces applied to the second mounting member 140 will tend to cause its mounting surface 144 to pull away from the anode electrode surface 29 of the SCR 30, thereby tending to decrease the mounting pressure exerted thereon in a manner which decreases with the square of the rotational speed of the motor 20. However, centrifugal force applied to the counterweight 185 simultaneously causes the counterweight 185 to exert a balancing force through its downwardly extending tip 188 upon the second mounting bsr 151. The counterweight 185 is sized, and the fulcrum 181 is positioned so as to insure that the force applied to the second clamping bar 151 by the counterweight stud 188 is exactly opposite in direction and equal in magnitude to the centrifugal force simultaneously applied to the second mounting member which tends to pull it away from the anode surface 29 of the SCR 30.

As a result, the two forces exactly cancel one another, thus insuring a constant mounting pressure upon the electrodes of the SCR 30 which equals the predetermined clamping pressure applied thereto regardless of the rotational speed of the motor 20.

While I have disclosed a specific embodiment of my invention, it is to be understood that this is for the purpose of illustration only, and that my invention is to be limited only by the scope of the appended claims.

What is claimed is:

1. Semiconductor mounting apparatus for applying controlled pressure to a disc-type semiconductor mounted on a rotatable member characterized by a pair of spaced axially aligned discs, of an electric machine, comprising:

a. first mounting means rigidly attached to and between said pair of discs of said rotatable member for rotation therewith, said first mounting means having a mounting surface for contacting a first electrode of the semiconductor to which pressure is to be applied;

b. second mounting means adapted for rotation with said rotatable member and having a mounting surface for contacting a second electrode of the disc-type semiconductor; and c. means for movably attaching said second mounting means to said rotatable member and in alignment with said first mounting means to sandwich the semiconductor therebetween such that said mounting surfaces of said first and second mounting means respectively contact said first and second electrode surfaces, for enabling said second mounting means to respond to centrifugal forces applied thereto, said movably attaching means including further, means arranged and configured for controlling the pressure applied to the semiconductor as a function of rotational speed of said rotatable member.

2. Apparatus according to claim 1, wherein said last named means comprises means for positioning said first and second mounting means between said pair of spaced discs on said rotatable member such that said second mounting means is urged toward said first mounting means under the influence of centrifugal force, thereby uniformly increasing the contact pressure on said first and second electrode surfaces of the semiconductor as a function of rotational speed; and wherein said movably attaching means includes resilient clamping means normally yieldingly urging said second mounting means toward said first mounting means, thereby applying a nominal contact pressure to said first and second electrodes of said semiconductor.

3. Apparatus for applying controlled pressure to a semiconductor mounted on a rotatable member of an electric machine, comprising:

a. first mounting means rigidly attached to said rotatable member, said first mounting means having a mounting surface for contacting a first electrode of a semiconductor to which pressure is to be applied;

b. second mounting means having a mounting surface for contacting a second electrode of the semiconductor;

c. means movably attaching said second mounting means to said rotatable member in alignment with said first mounting means and the semiconductor for enabling said second mounting means to respond to centrifugal forces applied thereto; and d. means for controlling the pressure applied to the semiconductor as a function of rotational speed of said rotatable member, including counterweight means pivotally attached to said rotatable member and engaging said second mounting means for counterbalancing the effect of centrifugal force thereon, thereby maintaining pressure on the semiconductor substantially independent of said rotational speed.

4. Apparatus for applying controlled pressure to a disc-type semiconductor adapted for mounting on a rotatable diode wheel of a brushless electric mahine, said diode wheel being of the type having inner and outer disc members axially aligned in spaced apart planes generally perpendicular to an axis of rotation of said diode wheel, said apparatus comprising:

a. a first heat sink mounting member rigidly attached to and between said inner and outer disc members of said diode wheel, having a generally planar mounting surface tangential to a circle concentric with said axis and for uniformly contacting a first electrode surface of the semiconductor to which pressure is to be applied;

b. a second heat sink mounting member sized for insertion between said inner and outer disc members and adapted for rotation with said diode wheel, having a generally planar mounting surface for uniformly contacting a second electrode surface of the semiconductor; and c. means movably attaching said second mounting member for rotation with said diode wheel and for aligning said second mounting member with said frist mounting member such that said mounting surfaces of said second and first mounting members simultaneously uniformly contact said second and first electrode surfaces respectively of the semiconductor, said second mounting member as movably attached being responsive to centrifugal force applied thereto for controlling the contact pressure applied to the electrode surfaces of the semiconductor.

5. Apparatus for applying controlled pressure to a disc-type semiconductor according to claim 4, wherein said first and second heat sink members include a plurality of passageways regularly disposed about the periphery of said mounting surfaces thereof and extending therethrough in a direction generally perpendicular to the planes of their mounting surfaces, there being respective ones of said passageways between said first and second heat sink members which are axially aligned with one another; and wherein said movably attaching mounting means comprises:

a. a plurality of rail means, one each slidably extending through said respectively aligned ones of said passageways for slidably orienting said second heat sink member with said first heat sink member such that their mounting surfaces are generally parallel to and oppose one another, each of said rail means having ends extending through said passageways and beyond those non-mounting surface disposed sides of said first and second heat sink members;

b. adjustable fastener means securing said ends of said rail means for adjustably mounting said second heat sink member in sliding relationship to said first heat sink member such that said semiconductor is sandwiched between said mounting surfaces of said first and second heat sink members; and c. resilient spring means interposed between said adjustable fastener means on the ends of said rail members and said non-mounting surface disposed sides of said first and second heat sink members for uniformly applying a predetermined contact pressure to said first and second electrode surfaces of the semiconductor, and for controllingly yielding to allow said second heat sink member to slidably move along said plurality of rail members toward said first sink member in response to centrifugal forces applied thereto.

6. Apparatus for applying controlled pressure to a semiconductor adapted for mounting on a rotatable diode wheel of a brushless electric machine comprising:

a. first mounting means rigidly attached to said diode wheel, having a mounting surface for uniformly contacting a first electrode surface of the semiconductor to which pressure is to be applied;

second mounting means adapted for rotation with said diode wheel having a mounting surface for uniformly contacting a second electrode surface of the semiconductor;

c. means for movably attaching said second mounting means for rotation with said diode wheel and for aligning said second mounting means with said first mounting means such that their mounting surfaces simultaneously apply uniform contact pressure to said second and first electrode surfaces respectively of the semiconductor, and such that said second mounting means is movably responsive to centrifugal force applied thereto; and d. counterweight means attached by a fulcrum to said diode wheel and engaging said second mounting means for counterbalancing the effect of centrifugal force thereon, said counterweight means being pivotally attached about said fulcrum to apply a controlled force to said second mounting means which varies with centrifugal force applied to the counterweight means.

7. Apparatus for applying controlled pressure to a semiconductor according to claim 6, wherein said means for movably attaching said second mounting means comprises clamping means movably attaching said second mounting means to said first mounting means.

8. Apparatus for applying controlled pressure to a semiconductor according to claim 7, wherein said clamping means includes spring washer and clamping bolt means cooperatively urging said first and second mounting means in contact with said first and second electrode surfaces of the semiconductor for applying a predetermined contact mounting pressure thereto.

9. Apparatus for applying controlled pressure to a semiconductor according to claim 7 wherein said clamping means clamps said second mounting means in radial alignment on said diode wheel with said first mounting means such that the first mounting means is relatively positioned closer to the center of the diode wheel, wherein said second mounting member is responsive to centrifugal force applied thereto during rotation to tend to exert controlled contact pressure on the electrodes of the semiconductor which decreases with the centrifugal force, and wherein said counterweight means applies a controlled force to said second mounting means whose magnitude and direction is exactly equal and opposite to the centrifugal force applied to the second mounting means for maintaining a constant contact pressure on the first and second electrodes of the semiconductor regardless of the rotational speed of the diode wheel.

* * * * *

UNITED STATES PATENT OFFICE
CERTIFICATE OF CORRECTION

Patent No. 3,838,303 Dated September 24, 1974

Inventor(s) Richard G. Ernst

It is certified that error appears in the above-identified patent and that said Letters Patent are hereby corrected as shown below:

In column 10, line 47, "140" should read --144-- .

In column 10, line 63, "compresses" should read --compress-- .

In column 13, line 6, "spparatus" should read --apparatus-- .

In column 14, line 42, "bsr" should read --bar-- .

Signed and sealed this 3rd day of December 1974.

(SEAL)
Attest:

McCOY M. GIBSON JR.
Attesting Officer

C. MARSHALL DANN
Commissioner of Patents